(12) United States Patent
Wei et al.

(10) Patent No.: US 12,520,487 B2
(45) Date of Patent: Jan. 6, 2026

(54) SEMICONDUCTOR STRUCTURE AND METHOD OF FORMING THE SAME

(71) Applicant: Winbond Electronics Corp., Taichung (TW)

(72) Inventors: Yuan-Huang Wei, Taichung (TW); Chien-Hsien Wu, Taichung (TW); Hsiu-Han Liao, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 622 days.

(21) Appl. No.: 17/941,534

(22) Filed: Sep. 9, 2022

(65) Prior Publication Data

US 2024/0090215 A1 Mar. 14, 2024

(51) Int. Cl.
| H01L 27/11531 | (2017.01) |
| H01L 27/11521 | (2017.01) |
| H10B 41/30 | (2023.01) |
| H10B 41/42 | (2023.01) |
| H10D 62/10 | (2025.01) |

(52) U.S. Cl.
CPC .............. H10B 41/42 (2023.02); H10B 41/30 (2023.02); *H10D 62/115* (2025.01)

(58) Field of Classification Search
CPC .............. H10B 41/42; H01L 21/76224; H01L 21/02164; H10D 84/0151; H10D 62/113; H10D 62/115
See application file for complete search history.

(56) References Cited

U.S. PATENT DOCUMENTS

| 6,642,596 | B2 | 11/2003 | Hong |
| 6,939,780 | B2 | 9/2005 | Yun et al. |
| 8,530,330 | B2 | 9/2013 | Ahn et al. |
| 9,184,088 | B2 | 11/2015 | Huang et al. |
| 2008/0001249 | A1 | 1/2008 | Sheen et al. |
| 2008/0014711 | A1* | 1/2008 | Choi ............... H01L 21/76229 438/424 |
| 2009/0162990 | A1* | 6/2009 | Ahn ................. H10D 84/038 257/E21.54 |

FOREIGN PATENT DOCUMENTS

| CN | 106571364 A | 4/2017 |
| CN | 110416218 A | 11/2019 |

* cited by examiner

*Primary Examiner* — John A Bodnar
(74) *Attorney, Agent, or Firm* — MUNCY, GEISSLER, OLDS & LOWE, P.C.

(57) ABSTRACT

The method of forming the semiconductor structure includes the following steps. First trenches and second trenches are respectively formed in a substrate of the logic region and the substrate of the array region. A dielectric liner is formed in the first trenches and second trenches. First coating blocks and second coating blocks are respectively formed in the first trenches and second trenches. A cap layer is formed on the first coating blocks and the second coating blocks. Oxide structures are formed on the cap layer. Part of the oxide structures and part of the cap layer is removed. A semiconductor layer is formed in the array region and disposed on the substrate and between the oxide structures.

20 Claims, 12 Drawing Sheets

SEMICONDUCTOR STRUCTURE AND METHOD OF FORMING THE SAME

BACKGROUND OF THE INVENTION

Field of the Invention

The present disclosure relates to a semiconductor structure and a method of forming the same, and in particular, to a method of forming a semiconductor structure that may prevent the oxide layer of the semiconductor structure from cracking to form defects, and to a semiconductor structure formed therefrom.

Description of the Related Art

During the fabrication of semiconductor structures, isolation structures (e.g., shallow trench isolation (STI) structures) may be formed by coating spin on glass (SOG) on dielectric liners. However, in subsequent processes, the isolation structure and the dielectric liner may crack due to thermal stress, thereby forming defects, which in turn lead to short circuits in the conductive structures (e.g., control gates), which are formed subsequently.

BRIEF SUMMARY OF THE INVENTION

The embodiment of the present disclosure provides a method of forming the semiconductor structure. By forming the dielectric liner and the cap layer on the isolation structure of the semiconductor structure, the isolation structure may be effectively prevented from cracking to form defects, thereby improving the overall yield of the semiconductor structure.

An embodiment of the present disclosure includes a method of forming a semiconductor structure, the semiconductor structure has an array region and a logic region around the array region, and the method of forming the semiconductor structure includes the following steps. A substrate is provided. First trenches are formed in the substrate of the logic region and second trenches are formed in the substrate of the array region. A dielectric liner is formed in the first trenches and second trenches. First coating blocks are formed in the first trenches and second coating blocks are formed in the second trenches. A cap layer is formed on the first coating blocks and the second coating blocks. Oxide structures are formed on the cap layer. Part of the oxide structures and part of the cap layer are removed. A semiconductor layer is formed in the array region, and the semiconductor layer is disposed between the oxide structures.

An embodiment of the present disclosure includes a semiconductor structure having an array region and a logic region around the array region. The semiconductor structure includes a substrate, first coating blocks in the substrate of the logic region, and second coating blocks in the substrate of the array region. The semiconductor structure also includes dielectric liners and cap layers covering the first coating blocks or the second coating blocks. The semiconductor structure further includes oxide structures disposed on the second coating blocks and a semiconductor layer disposed between the oxide structures.

BRIEF DESCRIPTION OF THE DRAWINGS

FIGS. 1A to 12A are partial cross-sectional views illustrating various stages of a method for forming a logic region of a semiconductor structure according to some embodiments of the present disclosure.

FIGS. 1B to 12B are partial cross-sectional views illustrating various stages of a method for forming an array region of a semiconductor structure according to some embodiments of the present disclosure.

DETAILED DESCRIPTION OF THE INVENTION

Figure 11A:
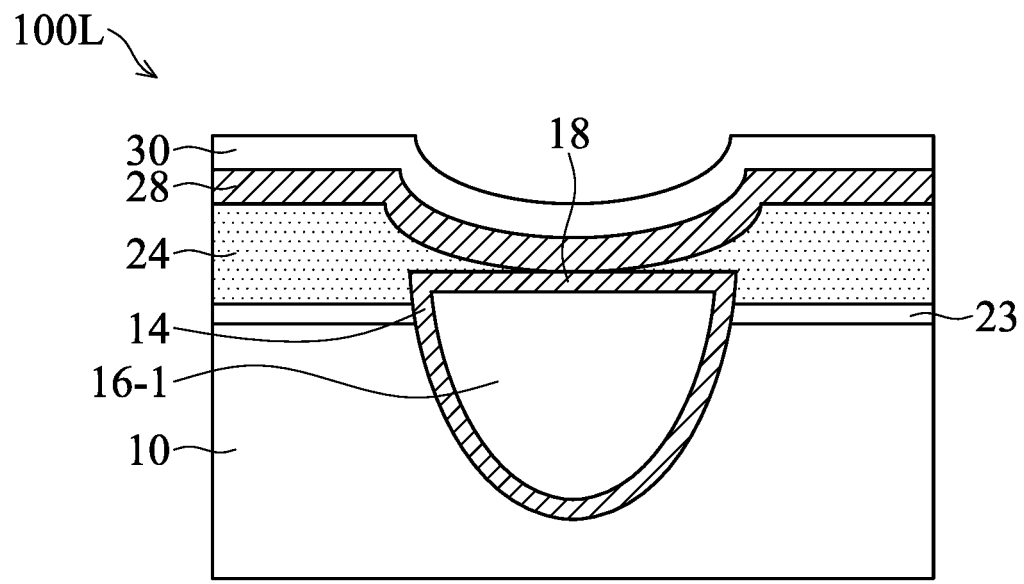
Figure 11B:
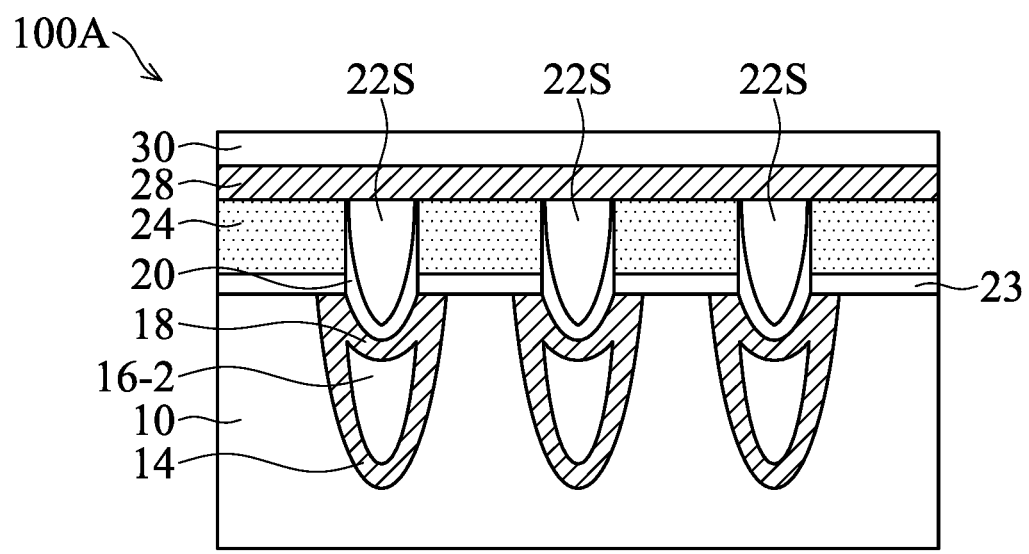
Figure 12A:
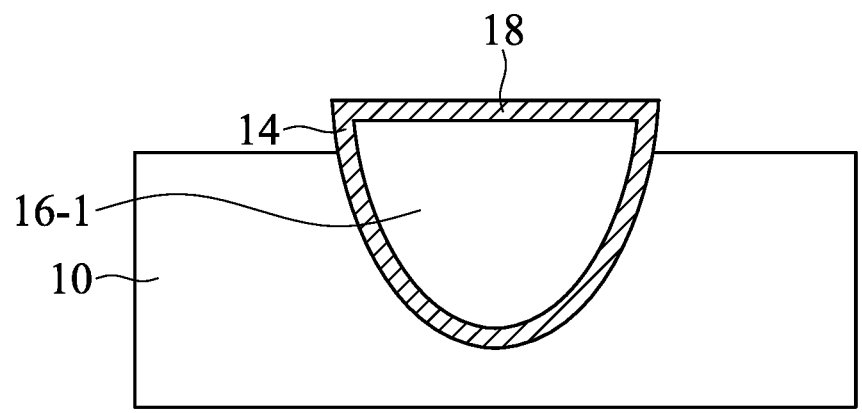
Figure 12B:
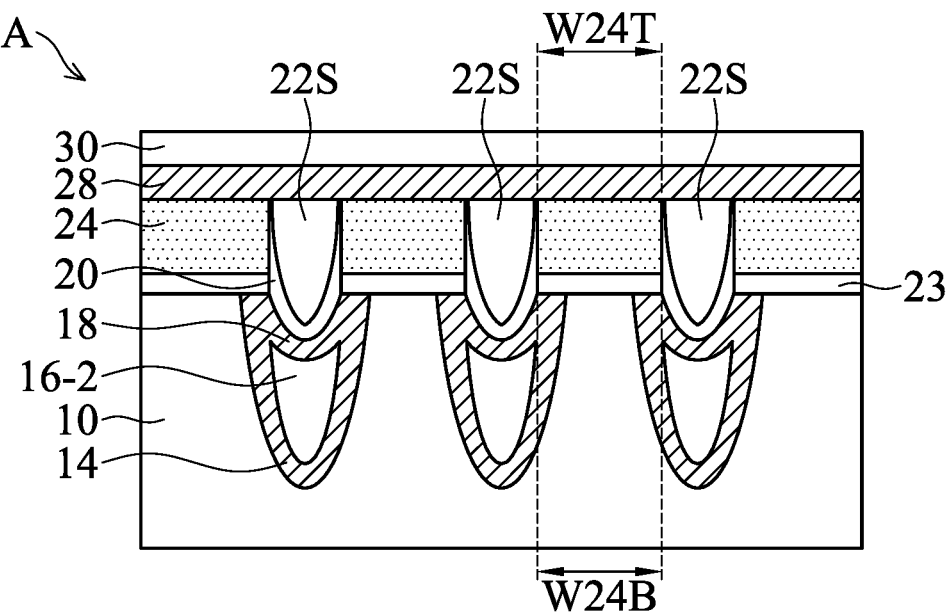

The semiconductor structure 100 according to the embodiments of the present disclosure (as shown in FIG. 12A and FIG. 12B) has an array region 100A and a logic region 100L, and the logic region 100L is disposed around the array region 100A, so that the logic region 100L may also be referred to as a peripheral region. Some components of the semiconductor structure 100 have been omitted in FIGS. 1A-12B for sake of brevity.

Figure 1A:
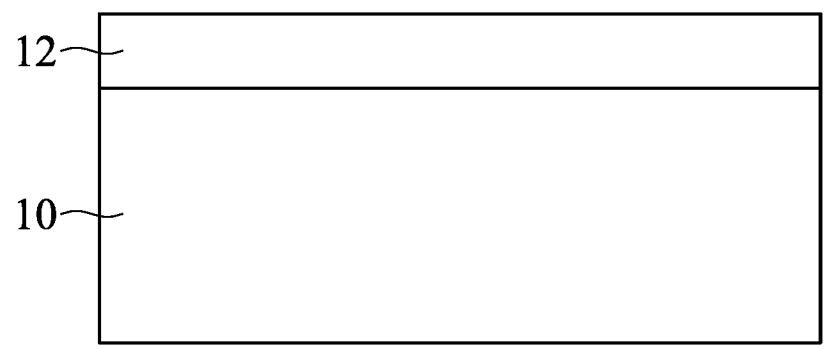
Figure 1B:
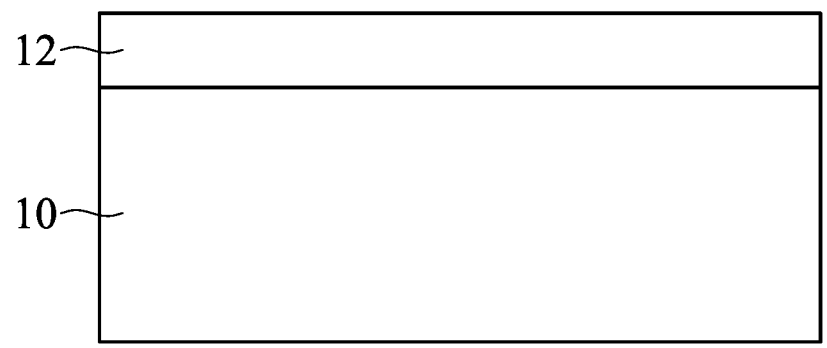

Referring to FIG. 1A and FIG. 1B, a first nitride layer 12 is formed on a substrate 10. The substrate 10 includes, for example, a semiconductor substrate, a bulk semiconductor substrate, a semiconductor-on-insulator (SOI) substrate, or a composite substrate formed of different materials. The substrate 10 may be doped (e.g., using p-type or n-type dopants) or undoped.

The first nitride layer 12 may include silicon nitride and may be formed on the substrate 10 by a deposition process. The deposition process includes, for example, chemical vapor deposition, atomic layer deposition, molecular beam epitaxy, liquid phase epitaxy, similar processes, or a combination thereof, but the present disclosure is not limited thereto.

Figure 2A:
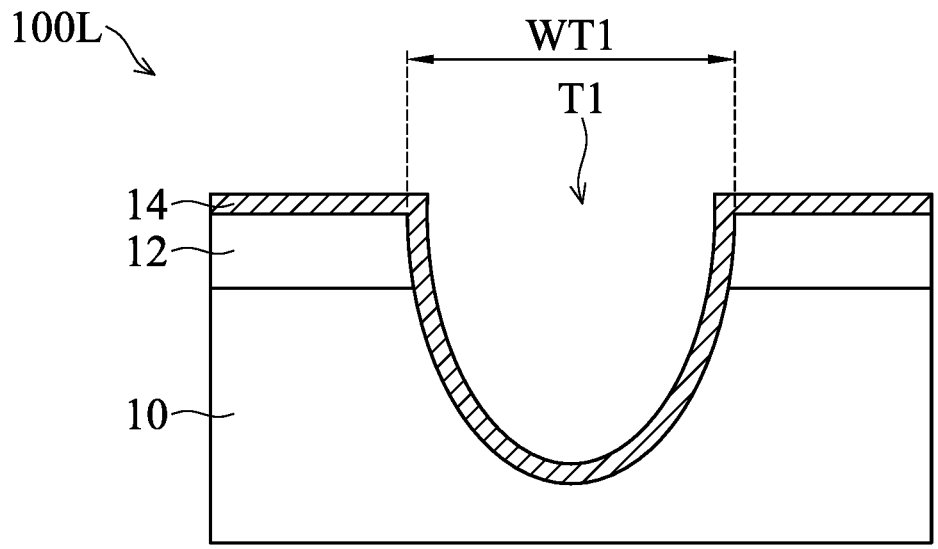
Figure 2B:
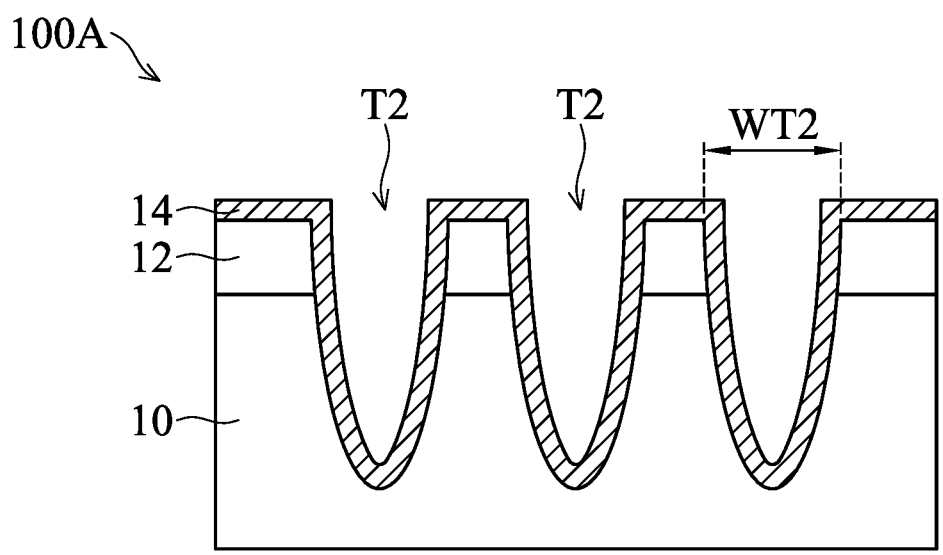

Referring to FIG. 2A and FIG. 2B, first trenches T1 (only one is shown in FIG. 2A) are formed in the logic region 100L and second trenches T2 are formed in the array region 100A. In some embodiments, the opening width WT1 of the first trench T1 is greater than the opening width WT2 of the second trench T2. Moreover, the number and density of the first trenches T1 per unit area may be smaller than that of the second trenches T2 per unit area, but the present disclosure is not limited thereto.

A mask layer (not shown) may be disposed on the first nitride layer 12 as an etching mask to perform an etching process, so as to etch the substrate 10 and the first nitride layer 12 to form the first trenched T1 and the second trenched T2. For example, the mask layer may include a photoresist or a hard mask. The mask layer may be a single-layer or a multi-layer structure.

The mask layer may be formed by, for example, a deposition process, a lithography process, other suitable processes, or a combination thereof. Here, the deposition process includes spin-on coating, chemical vapor deposition, atomic layer deposition, similar processes, or a combination thereof; the lithography process may include photoresist coating (e.g., spin-on coating), soft baking, mask aligning, exposure, post-exposure baking (PEB), developing, rinsing, drying (e.g., hard baking), other suitable processes, or a combination thereof, but the present disclosure is not limited thereto.

Next, a dielectric liner 14 is formed in the first trenches T1, in the second trenches T2, and on the first nitride layer 12. The dielectric liner 14 includes, for example, an insulating material (e.g., silicon oxide, silicon nitride, or silicon oxynitride), and may be formed by a deposition process, but the present disclosure is not limited thereto. Next, a heat treatment process is performed. For example, a thermal anneal process or rapid thermal processing (RTP) may be performed to harden the dielectric liner 14.

Figure 3A:
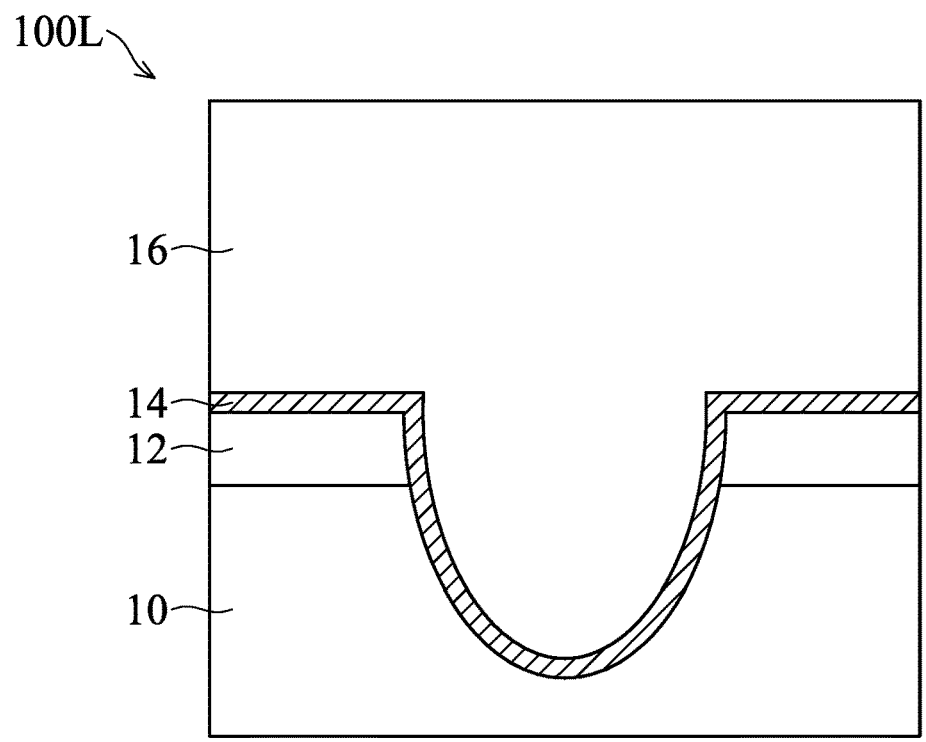
Figure 3B:
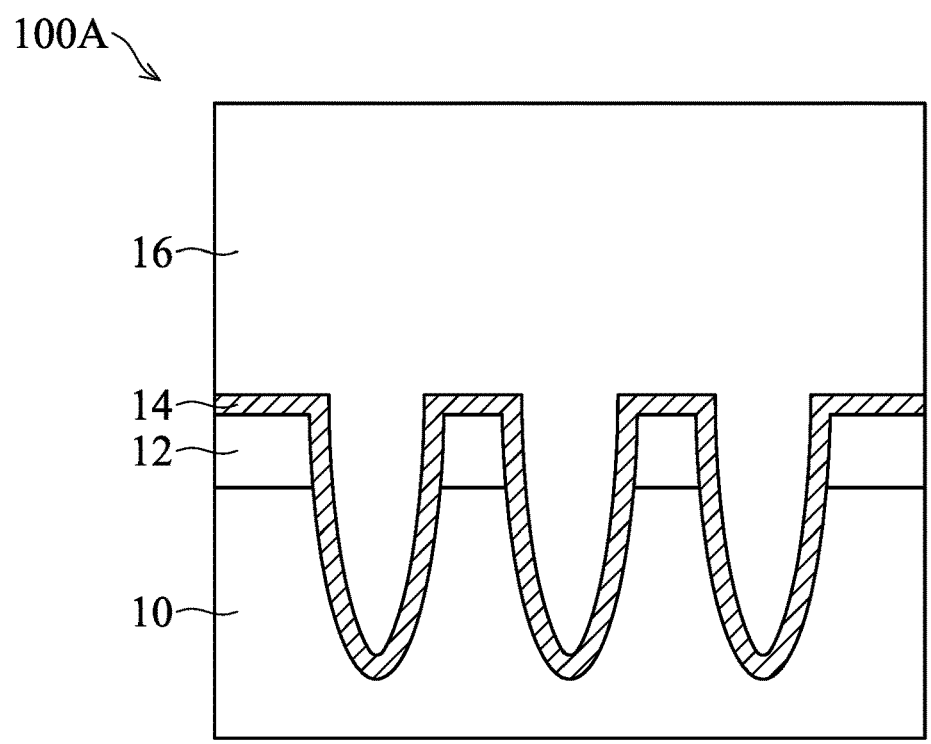

Referring to FIG. 3A and FIG. 3B, a coating layer 16 is formed on the dielectric liner 14. The coating layer 16 includes, for example, an insulating material (e.g., spin-on-glass (SOG)), but the present disclosure is not limited thereto. In detail, the coating layer 16 may be formed on the top surface of the dielectric liner 14 and fill the first trenches T1 and the second trenches T2.

Figure 4A:
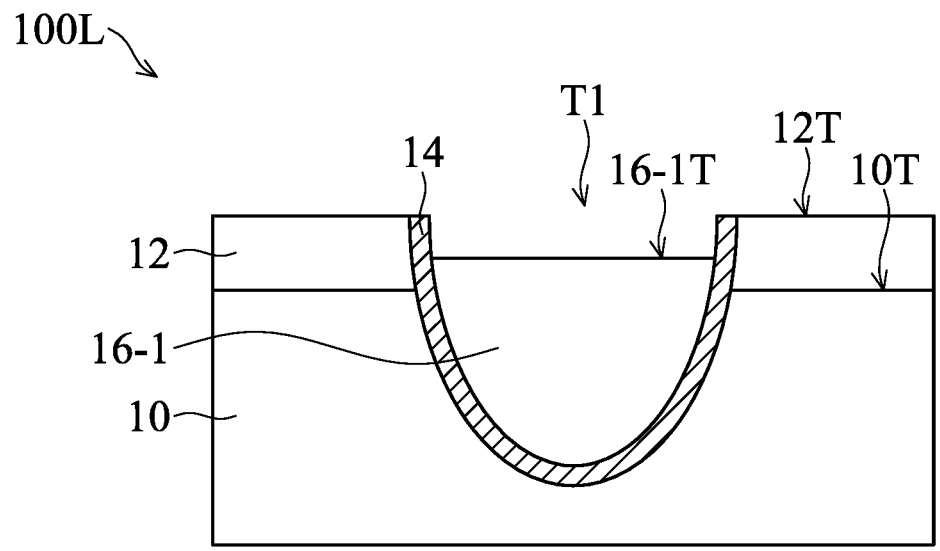
Figure 4B:
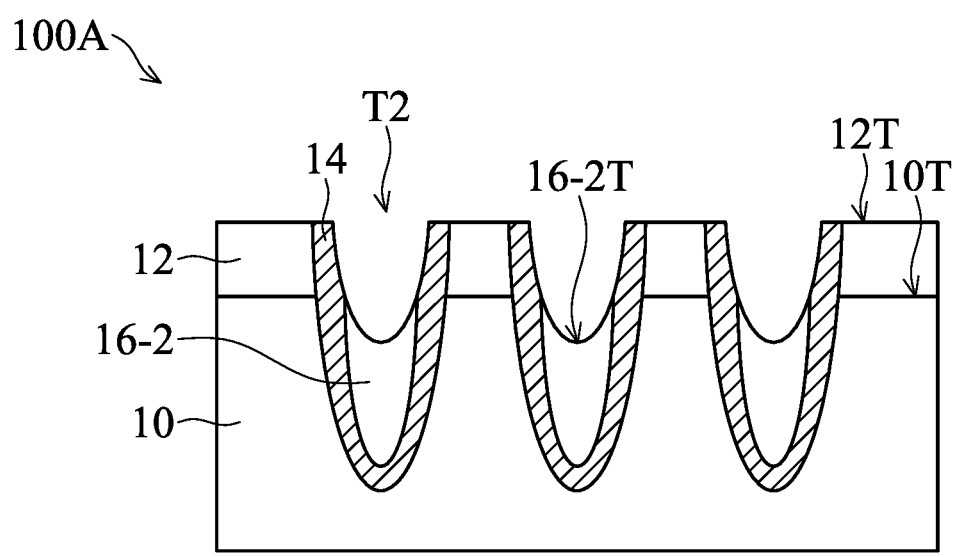

Referring to FIG. 4A and FIG. 4B, part of the dielectric liner 14 and part of the coating layer 16 are removed to form first coating blocks 16-1 (only one is shown in FIG. 4A) in the first trenches T1 and form second coating blocks 16-2 in the second trenches T2. In some embodiments, the top surface 16-1T of the first coating block 16-1 is higher than the top surface 10T of the substrate 10, and the top surface 16-2T of the second coating block 16-2 is lower than the top surface 10T of the substrate 10. Here, the top surface 16-1T of the first coating block 16-1 is, for example, a flat surface, and the top surface 16-2T of the second coating block 16-2 is, for example, a concave surface. The location of the top surface 16-2T of the second coating block 16-2 may be considered as the location of the lowest point of the concave surface.

Specifically, in some embodiments, a planarization process is performed to remove the dielectric liner 14 and the coating layer 16 on the top surface 12T of the first nitride layer 12, so that the coating layer 16 and the first nitride layer 12 are substantially coplanar. Next, in some embodiments, a wet etching process is performed to remove part of the coating layer 16 in the first trenched T1 and remain the first coating blocks 16-1, and remove part of the coating layer 16 in the second trenches T2 and remain the second coating blocks 16-2. The planarization process includes, for example, a chemical mechanical polishing (CMP) process, and the wet etching process may include a dilute HF cleaning (DHF) process. Since the dielectric liner 14 and the coating layer 16 have etching selectivity, the etching rates of the etchant to the dielectric liner 14 and the coating layer 16 are different. Therefore, after performing the wet etching process, the dielectric liner 14 may remain on the sidewalls of the first trenches T1 and the second trenches T2.

Figure 5A:
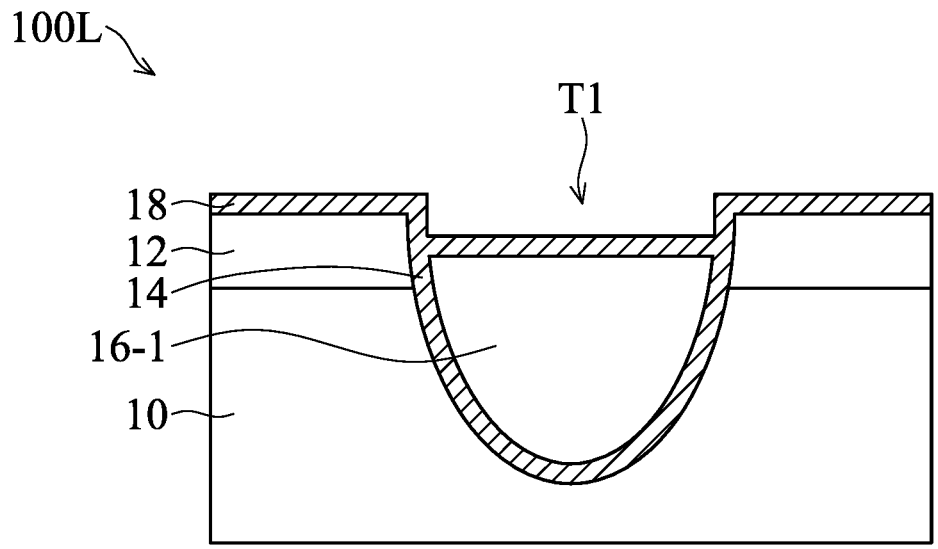
Figure 5B:
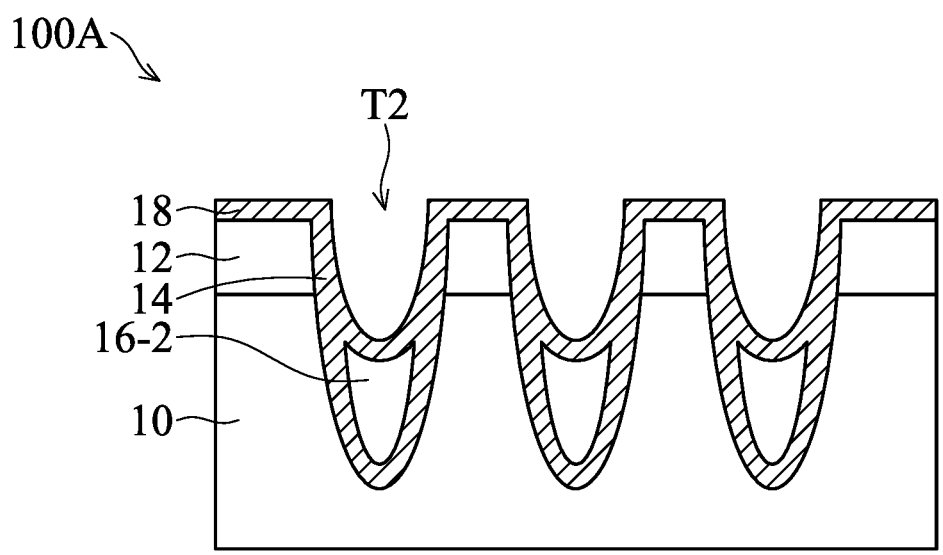

Referring to FIG. 5A and FIG. 5B, a cap layer 18 is formed on the first coating blocks 16-1, the second coating blocks 16-2, and the first nitride layer 12. For example, the materials and method of forming the cap layer 18 may be the same as or similar to those of dielectric liner 14. In other words, the cap layer 18 may be formed on the first coating blocks 16-1, the second coating blocks 16-2, and the first nitride layer 12 using a deposition process, but the present disclosure is not limited thereto. In some embodiments, the cap layer 18 over the first coating blocks 16-1 has a flat structure, and the cap layer 18 over the second coating blocks 16-2 has a concave structure.

Next, in some embodiments, a heat treatment process is performed. For example, a thermal annealing process or rapid thermal treatment (which may be referred to as a thermal densifying process) may be performed to harden the cap layer 18. Here, the cap layer 18 (and part of the dielectric liner 14) may serve as an etch stop layer in the subsequent process, but the present disclosure is not limited thereto.

Figure 6A:
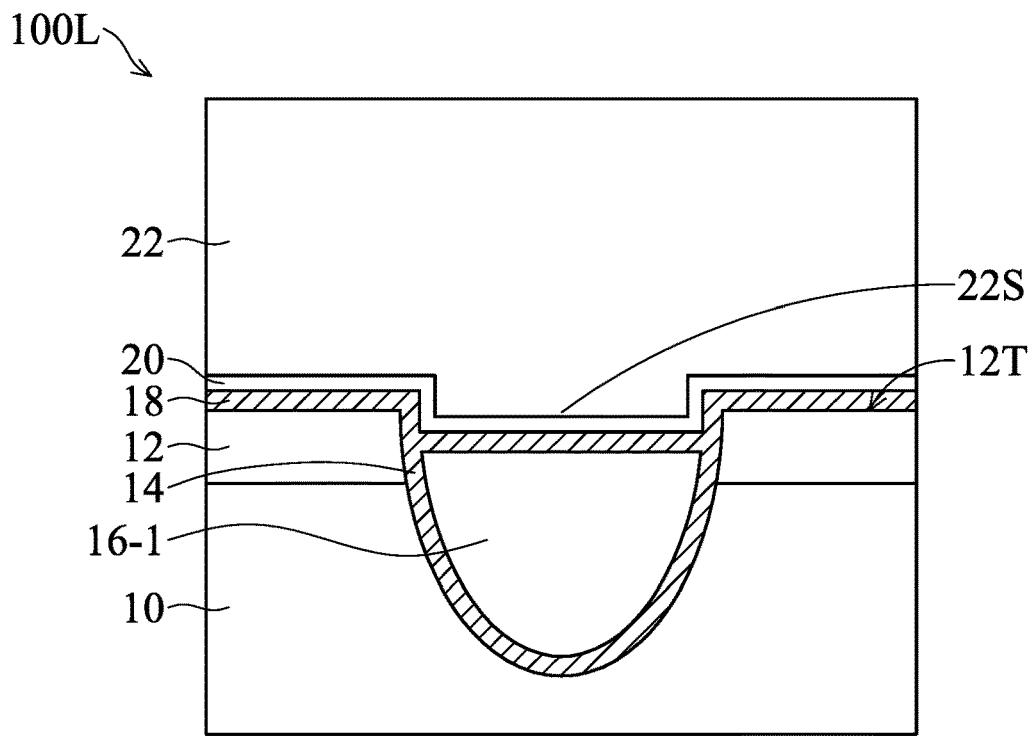
Figure 6B:
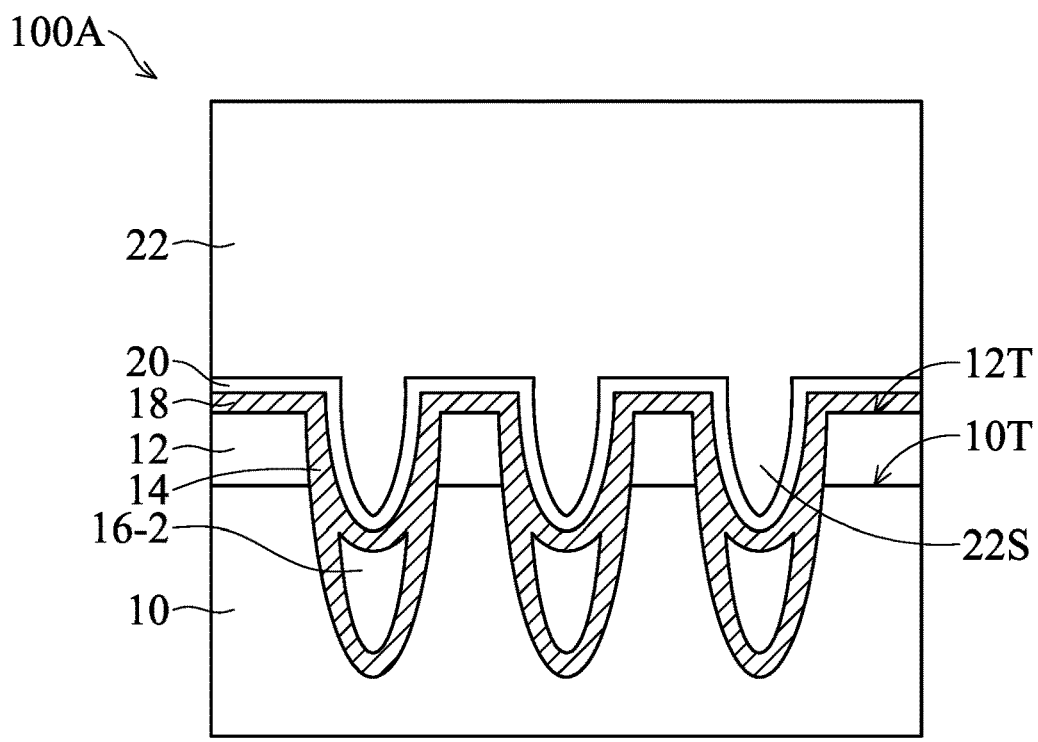

Referring to FIG. 6A and FIG. 6B, a pre-liner 20 is formed on the cap layer 18. Next, a first oxide layer 22 is formed on the cap layer 18 and the pre-liner 20. In other words, the pre-liner 20 is disposed between the cap layer 18 and the first oxide layer 22. In some embodiments, the bottommost portion of the first oxide layer 22 is lower than the topmost portion of the cap layer 18 and the pre-liner 20 in the logic region 100L and the array region 100A. The pre-liner 20 and the first oxide layer 22 may include oxides such as silicon oxide, for example. Moreover, the pre-liner 20 and the first oxide layer 22 may be sequentially formed on the cap layer 18 by a deposition process.

As shown in FIG. 6A and FIG. 6B, in some embodiments, part of the first oxide layer 22 is filled in the first trenches T1 and the second trenches T2 to form oxide structures 22S. In the array region 100A, the bottommost portion of each oxide structure 22S is below the top surface 10T of the substrate 10. Next, in some embodiments, a high-density plasma treatment is performed on the first oxide layer 22.

Figure 7A:
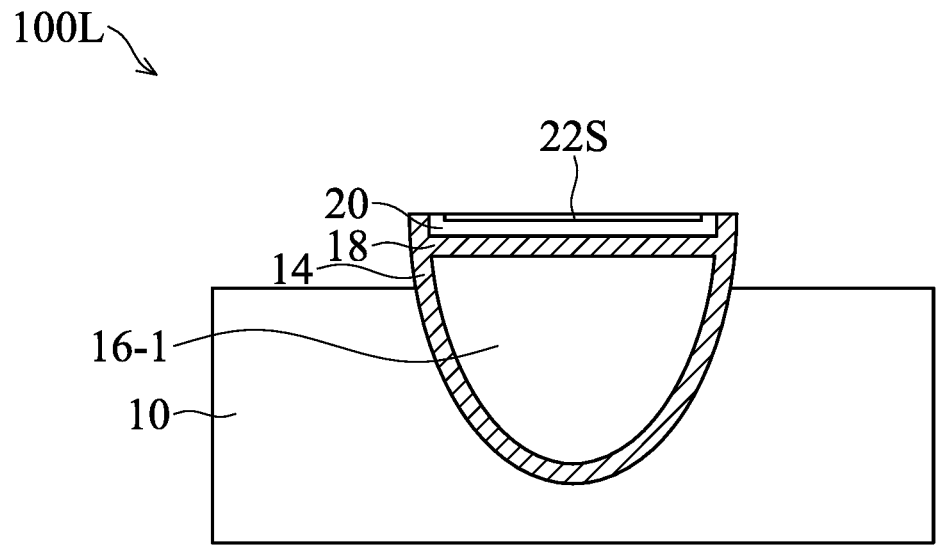
Figure 7B:
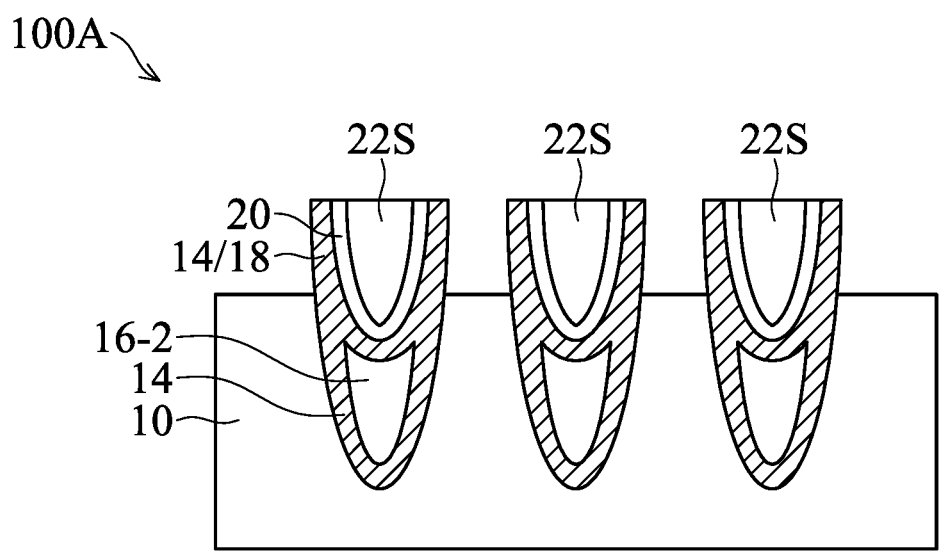

Referring to FIG. 7A and FIG. 7B, in some embodiments, part of the first oxide layer 22, part of the pre-liner 20, and part of the cap layer 18 on the top surface 12T of the first nitride layer 12 are removed. For example, a planarization process (e.g., a CMP process) is performed to remove part of the first oxide layer 22, part of the pre-liner 20, and part of the cap layer 18 on the top surface 12T of the first nitride layer 12. Next, in some embodiments, the first nitride layer 12 is removed. For example, phosphoric acid may be used as an etching solution, and the first nitride layer 12 may be removed by a wet etching process, but the present disclosure is not limited thereto.

Figure 8A:
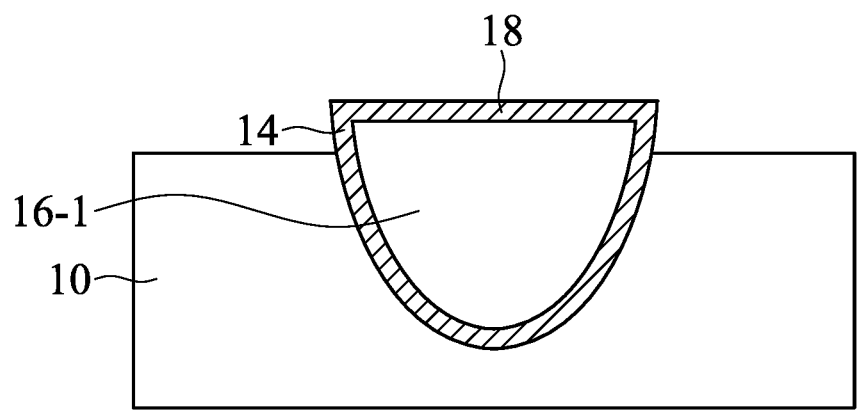
Figure 8B:
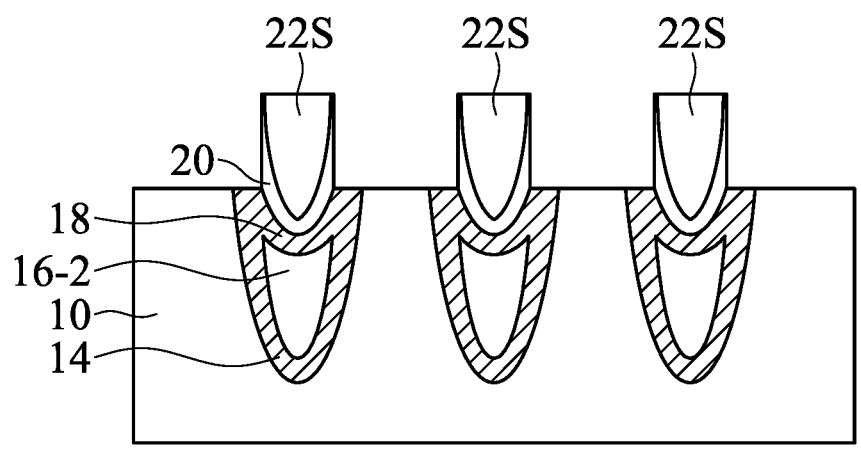

Referring to FIG. 8A and FIG. 8B, in some embodiments, a pre-cleaning process is performed to remove the pre-liner 20 and the oxide structure 22S remaining on the cap layer 18 (on the first coating block 16-1) in the logic region 100L, so that the remaining dielectric liner 14 and cap layer 18 surround the first coating block 16-1. In some embodiments, the pre-liner 20 and the oxide structure 22S remaining on the cap layer 18 (on the first coating block 16-1) in the logic region 100L may also be removed by the planarization process in the previous step. During the planarization or pre-cleaning process, since the structure of the logic region 100L is relatively open, a dishing effect is generated, causing the oxide structures 22S in the logic region 100L to be removed. In some embodiments, after the pre-cleaning process is completed, the top surface of the cap layer 18 remaining in the logic region 100L is a flat structure.

Compared with the logic area 100L, since the pattern size of the array region 100A is different from that of the logic region 100L, the oxide structures 22S in the array region 100A are only partially affected or not affected by the planarization/pre-cleaning process. Therefore, the oxide structures 22S in the array region 100A are only partially removed or not removed.

Moreover, a pre-cleaning process is performed to remove the dielectric liner 14/cap layer 18 and part of the pre-liner 20 on both sides of the oxide structure 22S (on the substrate 10) in the array region 100A, so that the remaining oxide structures 22S and pre-liner 20 are formed into an approximately vertical profile. For example, the sidewalls of the remaining pre-liner 20 and the substrate 10 have an included angle of 85 degrees to 95 degrees. After the pre-cleaning process is performed, the pre-liner 20 forms an upwardly tapered structure. The pre-clean process includes, but is not limited to, a wet etching process (e.g., a diluted hydrofluoric acid cleaning (DHF) process).

Figure 9A:
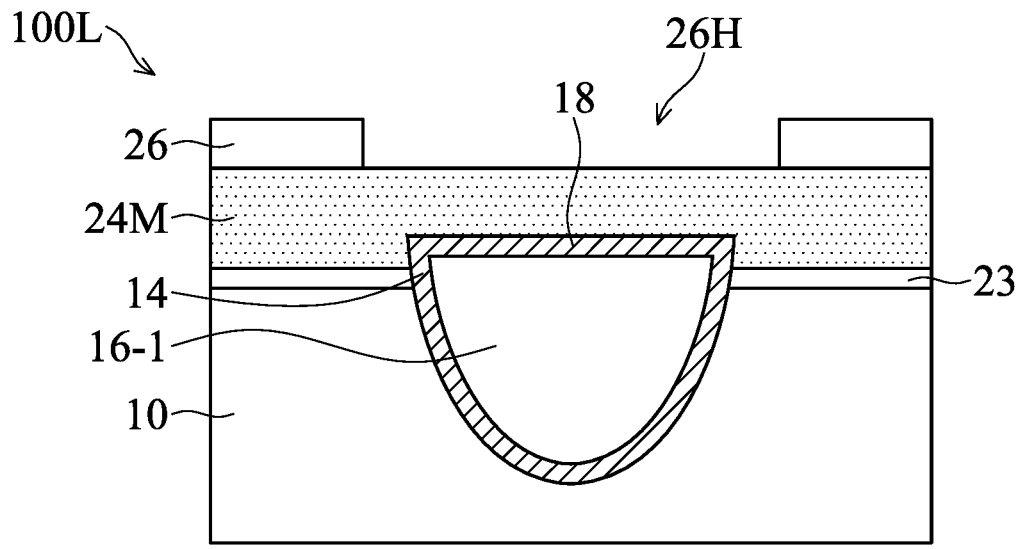
Figure 9B:
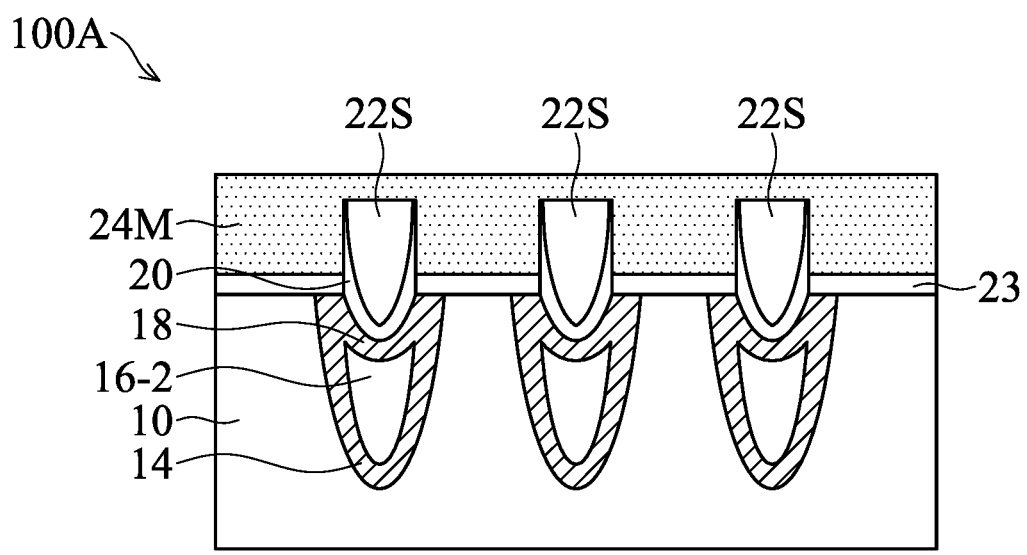

Referring to FIG. 9A and FIG. 9B, a tunnel oxide layer 23 and a semiconductor material layer 24M are sequentially formed on the substrate 10. In detail, the semiconductor material layer 24M is formed on the substrate 10, the first coating blocks 16-1, and the second coating blocks 16-2. Moreover, in the array region 100A, the tunnel oxide layer 23 and the semiconductor material layer 24M are disposed between the substrate 10 and the oxide structures 22S. The tunnel oxide layer 23 and the semiconductor material layer 24M may be formed by a deposition process.

For example, the semiconductor material layer 24M may include elemental semiconductors (e.g., silicon, germanium, etc.), compound semiconductors (e.g., silicon carbide (SiC), gallium arsenide (GaAs), indium arsenide (InAs), or indium phosphide (InP), etc.), alloy semiconductors (e.g., silicon germanium (SiGe), silicon germanium carbide (SiGeC), gallium arsenide phosphide (GaAsP) or gallium indium phosphide (GaInP), etc.), other suitable semiconductors, or a combination thereof, but the present disclosure is not limited thereto.

Next, as shown in FIG. 9A, in some embodiments, a barrier layer 26 is formed in the logic region 100L, and the barrier layer 26 has holes 26H (only one is shown in FIG. 9A) that correspond to the first coating blocks 16-1. In other words, the holes 26H may expose the portion of the semiconductor material layer 24M corresponding to the first coating blocks 16-1.

For example, the barrier layer 26 includes a nitride, such as silicon nitride. Moreover, a mask layer (not shown) may be disposed on the barrier material as an etching mask to perform an etching process to form the barrier layer 26 that has holes 26H. The mask layer may be formed by, for example, a deposition process, a lithography process, other suitable processes, or a combination thereof.

Figure 10A:
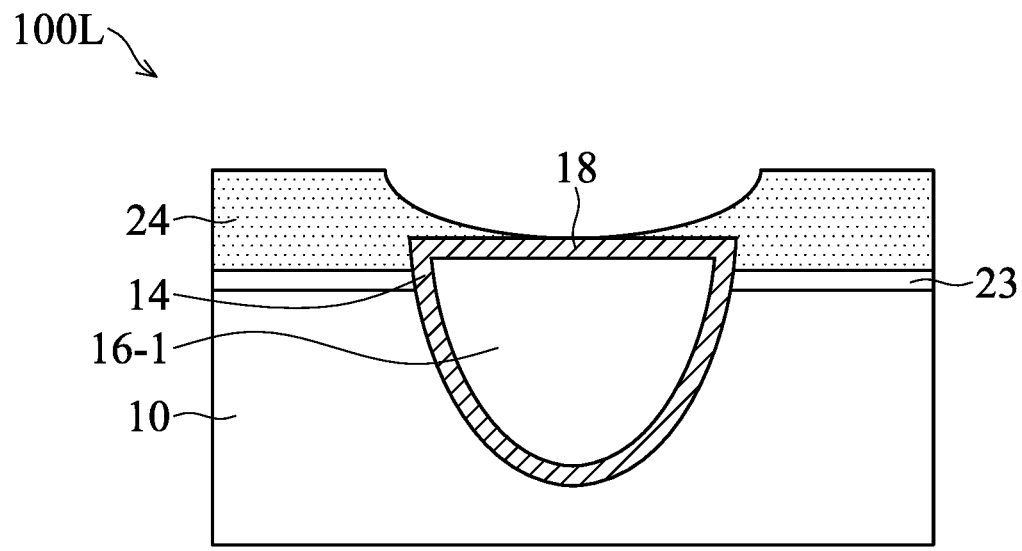
Figure 10B:
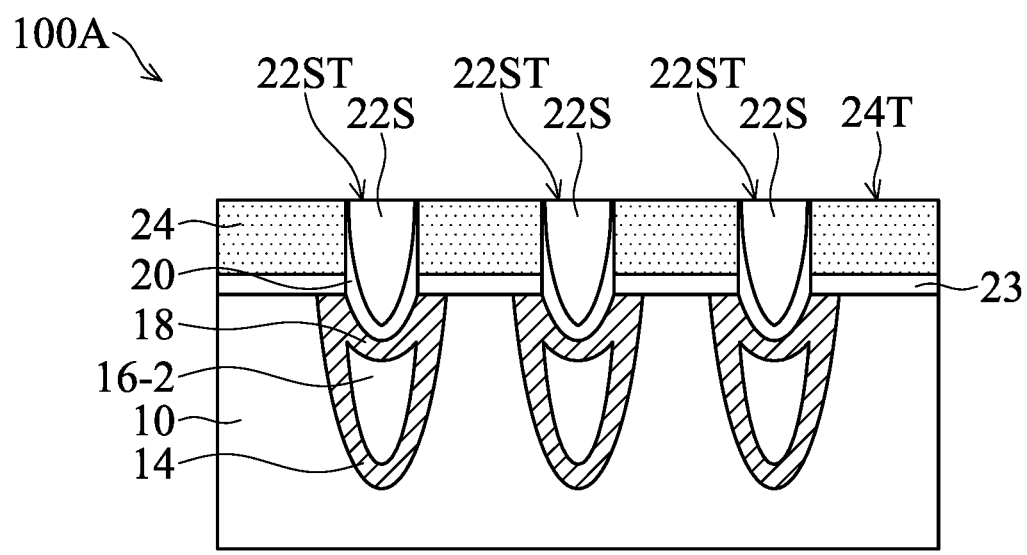

Referring to FIG. 10A and FIG. 10B, in some embodiments, a planarization process is performed. Specifically, a planarization process is performed to remove part of the semiconductor material layer 24M in the array region 100A to form the semiconductor layer 24 and to expose the top surfaces 22ST of the oxide structures 22S. For example, the planarization process may include a CMP process, but the present disclosure is not limited thereto.

In the logic region 100L, the barrier layer 26 protects the structure of the logic region 100L from being excessively removed by utilizing the high selectivity of the slurry to the barrier layer 26. Therefore, only part of the semiconductor material layer 24M exposed by the holes 26H is removed, and the semiconductor material layer 24M under the barrier layer 26 may be remained to form the semiconductor layer 24, and the barrier layer 26 is only partially or hardly removed during the planarization process. Next, the barrier layer 26 in the logic region 100L may be removed by a wet etching process, for example, using phosphoric acid as an etching solution.

As shown in FIG. 10B, in some embodiments, the semiconductor layer 24 is disposed between the oxide structures 22S, and the top surface 24T of the semiconductor layer 24 and the top surfaces 22ST of the oxide structures 22S are substantially coplanar, but the present disclosure is not limited thereto.

Referring to FIG. 11A and FIG. 11B, a second oxide layer 28 and a second nitride layer 30 are sequentially formed on the semiconductor layer 24 and the oxide structures 22S. The materials and method of forming the second oxide layer 28 may be the same as or similar to those of the first oxide layer 22, and the materials and method of forming the second nitride layer 30 may be the same as or similar to those of the first nitride layer 12.

Referring to FIG. 12A, in some embodiments, the second nitride layer 30, the second oxide layer 28, and the semiconductor layer 24 (or the semiconductor material layer 24M) in the logic region 100L are removed to form the semiconductor structure 100. For example, the array region 100A may be covered first, and then a dry etching process may be performed on the logic region 100L to sequentially remove the second nitride layer 30, the second oxide layer 28, and the semiconductor layer 24.

Referring to FIG. 12A and FIG. 12B, the semiconductor structure 100 includes a substrate 10, first coating blocks 16-1 (only one is shown in FIG. 12A) and second coating blocks 16-2, the first coating blocks 16-1 are disposed in the substrate 10 and in the logic region 100L, and the second coating blocks 16-2 are disposed in the substrate 10 and in the array region 100A.

The semiconductor structure 100 also includes dielectric liners 14 and cap layers 18. Each the dielectric liner 14 and each cap layer 18 covers the corresponding first coating block 16-1 or the second coating block 16-2. In some embodiments, the dielectric liner 14 is disposed on the sidewalls of the first coating block 16-1 or the second coating block 16-2, and the cap layer 18 is disposed on the top surface of the first coating block 16-1 or the second coating block 16-2. In some embodiments, the dielectric liners 14 and the cap layers 18 are hardened oxide layers.

The first coating block 16-1 may be regarded as an isolation structure (e.g., a shallow trench isolation (STI) structure) of the semiconductor structure 100. Since the dielectric liner 14 and the cap layer 18 cover the first coating block 16-1 (i.e., the isolation structure), the isolation structure may be effectively prevented from cracking to form defects. In some embodiments, the dielectric liners 14 and the cap layers 18 may serve as etch stop layers during the manufacturing process, thereby improving the overall yield of the semiconductor structure 100.

The semiconductor structure 100 further includes oxide structures 22S and a semiconductor layer 24. The oxide structures 22S are disposed on the second coating blocks 16-2 (and the cap layers 18), and the semiconductor layer 24 is disposed between the oxide structures 22S. As shown in FIG. 12B, in some embodiments, the semiconductor layer 24 has a substantially constant width.

Due to the dielectric liners 14 and the cap layers 18, when the pre-cleaning process (as shown in FIG. 8B) is performed, the remaining oxide structures 22S and pre-liner 20 in the array region 100A form a substantially vertical profile, so that the subsequently formed semiconductor layer 24 may have substantially vertical sidewalls (i.e., have a substantially constant width). Compared with the semiconductor layer formed by the conventional technology, the semiconductor layer 24 according to the embodiments of the present disclosure is more uniform, and seams are not easily generated. In some embodiments, the ratio of the width W24T of the top of the semiconductor layer 24 to the width W24B of the bottom of the semiconductor layer 24 is between about 0.9 and about 1.1.

Based on the above description, in the method for forming the semiconductor structure according to the embodiments of the present disclosure, by forming the dielectric liner and the cap layer on the isolation structure of the semiconductor structure, the isolation structure of the semiconductor structure may be effectively prevented from cracking to form defects, thereby improving the overall yield of the semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

The described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A method of forming a semiconductor structure that has an array region and a logic region around the array region, comprising:
   providing a substrate;
   forming first trenches in the substrate of the logic region and forming second trenches in the substrate of the array region;
   forming a dielectric liner in the first trenches and second trenches;
   forming first coating blocks in the first trenches and forming second coating blocks in the second trenches;
   forming a cap layer on the first coating blocks and the second coating blocks;
   forming oxide structures on the cap layer;
   removing part of the oxide structures and part of the cap layer; and
   forming a semiconductor layer in the array region, wherein the semiconductor layer is disposed between the oxide structures, and a top surface of the semiconductor layer and top surfaces of the oxide structures are coplanar.

2. The method of forming the semiconductor structure as claimed in claim 1, wherein the step of forming the first coating blocks and the second coating blocks comprises:
   forming a coating layer on the dielectric liner; and
   performing a planarization process to remove part of the dielectric liner and part of the coating layer.

3. The method of forming the semiconductor structure as claimed in claim 2, wherein after the step of performing the planarization process, performing a wet etching process to remove part of the coating layer in the first trenches and remain the first coating blocks, and remove part of the second trenches and remain the second coating blocks.

4. The method of forming the semiconductor structure as claimed in claim 1, further comprising:
   performing a heat treatment process after forming the dielectric liner.

5. The method of forming the semiconductor structure as claimed in claim 1, further comprising:
   performing a heat treatment process after forming the cap layer.

6. The method of forming the semiconductor structure as claimed in claim 1, further comprising:
   forming a pre-liner on the cap layer, wherein the pre-liner is disposed between the cap layer and the oxide structures.

7. The method of forming the semiconductor structure as claimed in claim 1, further comprising:
   forming a first oxide layer on the cap layer, wherein part of the first oxide layer fills the second trenches to form the oxide structures; and
   performing a high-density plasma treatment on the first oxide layer.

8. The method of forming the semiconductor structure as claimed in claim 1, wherein a planarization process is performed to remove part of the first oxide layer and part of the cap layer.

9. The method of forming the semiconductor structure as claimed in claim 1, further comprising:
   forming a tunnel oxide layer between the semiconductor layer and the substrate.

10. The method of forming the semiconductor structure as claimed in claim 1, wherein the step of forming the semiconductor layer comprises:
    forming a semiconductor material layer on the substrate, the first coating blocks and the second coating blocks;
    forming a barrier layer in the logic region, wherein the barrier layer has holes that correspond to the first coating blocks;
    performing a planarization process to remove part of the semiconductor material layer in the array region to form the semiconductor layer and to expose top surfaces of the oxide structures; and
    removing the semiconductor material layer in the logic region.

11. The method of forming the semiconductor structure as claimed in claim 1, further comprising:
    sequentially forming a second oxide layer and a nitride layer on the semiconductor layer and the oxide structures.

12. The method of forming the semiconductor structure as claimed in claim 1, further comprising:
    forming a first nitride layer on the substrate, wherein the first nitride layer is between the substrate and the dielectric liner.

13. The method of forming the semiconductor structure as claimed in claim 12, further comprising:
    removing the first nitride layer before forming the semiconductor layer.

14. A semiconductor structure having an array region and a logic region around the array region, comprising:
    a substrate;
    first coating blocks in the substrate of the logic region;
    second coating blocks in the substrate of the array region;
    dielectric liners and cap layers covering the first coating blocks or the second coating blocks;
    oxide structures disposed on the second coating blocks; and
    a semiconductor layer disposed between the oxide structures, wherein a top surface of the semiconductor layer and top surfaces of the oxide structures are coplanar.

15. The semiconductor structure as claimed in claim 14, wherein a ratio of a width of a top of the semiconductor layer to a width of a bottom of the semiconductor layer is between 0.9 and 1.1.

16. The semiconductor structure as claimed in claim 14, wherein materials of the dielectric liners are the same as materials of the cap layers.

17. The semiconductor structure as claimed in claim 14, wherein the dielectric liners and the cap layers are hardened oxide layers.

18. The semiconductor structure as claimed in claim 14, wherein top surfaces of the first coating blocks are higher than a top surface of the substrate.

19. The semiconductor structure as claimed in claim 14, wherein top surfaces of the second coating blocks are lower than a top surface of the substrate.

20. The semiconductor structure as claimed in claim 14, wherein in the array region, a bottommost portion of each of the oxide structures is below a top surface of the substrate.

* * * * *